DIFFUSED-BASE TRANSISTORS, PREFERABLY FOR HIGH-FREQUENCY OPERATION

Filed Jan. 15, 1963

United States Patent Office 3,220,894

Patented Nov. 30, 1965

3,220,894

DIFFUSED-BASE TRANSISTORS, PREFERABLY FOR HIGH-FREQUENCY OPERATION

Hugo Rüchardt, Gauting, near Munich, and Hans Hargasser, Winfried Meer, and Hellmuth Heissing, Munich, Germany, assignors to Siemens & Halske Aktiengesellschaft, Munich, Germany, a corporation of Germany Filed Jan. 15, 1963, Ser. No. 251,621
Claims priority, application Germany, Jan. 18, 1962, S 77,593
2 Claims. (Cl. 148—33)

Our invention relates generally to transistors of the three-electrode mesa or planar types, both having the base region diffused into a collector plate, pellet or slab. In a more particular aspect, the invention concerns mesa and planar transistors for operation at high frequencies.

Such transistors comprise a body of fundamental collector material which carries on its top the other active semiconductor regions. Diffused into the collector material, such as monocrystalline germanium, is a thin base region which, in the case of a mesa transistor, has the configuration of a stepped protuberancet or mesa produced by etching some of the material of the supporting slab away. The emitter and base connections are produced by vaporizing suitable materials upon the diffusion-bonded base region, and the emitter-base p-n junction is obtained by alloying some of the vapor-deposited emitter-connection material into the base region or by diffusing part of the connecting material into the base region. In planar transistors, the regions diffused into the original crystalline body and having alternately different types of conductance follow each other, the resulting p-n junctions being planar and laterally limited by an oxide coating abutting against, and partially covering the junction.

While diffused-base transistors, particularly mesa and planar type transistors as described above, are advantageous from various manufacturing and performance viewpoints, they are subject to certain effects undesirable for some purposes and occuring at relatively high current loading, including current switching operations, or at high operating frequencies.

One of these effects is the so-called $\alpha^*$-effect, namely an augmented increase of the current amplification factor $\alpha$ (corresponding to the inverse value of current gain), such increase being up to values above unity when a given current value is exceeded. This loss of positive current gain and instability of the working point is due to the fact that self-heating of the transistor at increasing amounts of current may cause the minority-carrier concentration to assume values close to the majority-carrier concentration. As a consequence the transistor will switch through and can no longer be controlled in the usual manner by changing the base current.

Another complication and impairment in transistor performance at relatively high current magnitudes results from the collector path resistance, this being the resistance constituted by the collector region having a finite thickness. Although the collector path resistance has the effect of limiting the transistor current, particularly in switching operations, this resistance is not a constant magnitude independent of the working point. Particularly in view of good high-frequency performance, it is desirable to keep the collector-path region in mesa transistors as small as feasible. However this can be done only to a limited extent for technological as well as physical reasons.

It is an object of our invention, relating to mesa and planar or the like transistors of the diffused-base type, to minimize the above-mentioned difficulties. Another, more specific object of the invention is to provide mesa or planar transistors that afford an improved possibility of control at high operating frequencies. It is also an object of our invention to improve the thermal stability of transistor operation at high current densities.

To achieve these objects, and in accordance with our invention, a three-electrode transistor of the mesa or planar type according to the invention, particularly for operation at high frequencies, comprises in its crystalline body, for example a monocrystalline slab or pellet of germanium, a sequence of four regions having respectively different conductance and different types of conductance; and one of these regions, located intermediate the collector slab and the diffused base region is high ohmic in comparison with the three other regions and has a type of conductance opposed to that of the base, the dopant concentration of the intermediate region being small in comparison with that of the collector fundmaental material, so that the effective base thickness at currents below a given current value is independent of the current magnitude.

According to another feature of our invention, the above-mentioned high ohmic region intermediate the collector main body and the base region consists of an epitaxial growth portion on the collector fundamental body. According to still another feature of our invention, the high-ohmic epitaxial region between the fundamental collector and the base is given a thickness which is large in comparison with that of the base. Preferably the thickness of the intermediate region is a multiple, namely more than twice, for example more than ten times, that of the base.

The above-mentioned and other objects, advantages, and features of our invention, said features being set forth with particularly in the claims annexed hereto, will be apparent from, and will be mentioned in, the following with reference to the embodiment of a transistor according to the invention illustrated by way of example on the accompanying drawing in which:

Figure 1:
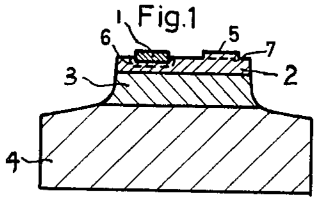
FIG. 1 is a sectional view of the transistor, the different regions being indicated schematically and on greatly enlarged scale.
Figure 4:
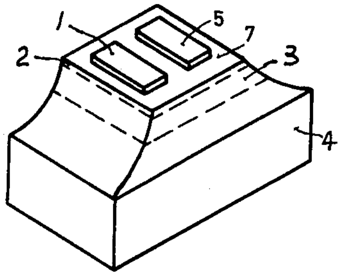
FIG. 4 shows the transistor of FIG. 1 by a schematic and perspective view.

The transistor shown in FIGS. 1 and 4 comprises an emitter contact or electrode 1, for example of aluminum, which is alloyed to the base region 2 of a monocrystalline semiconductor body of germanium. The base region 2 has n-type conductance and forms with the emitter region a p-n junction at 6. The bulk of the semiconductor body, comprising an intermediate layer 3 and a fundamental slab 4, has p-type conductance so that a collector p-n junction is formed between regions 2 and 3.

The transistor is made as follows. Used as starting material is a slab or plate 4 cut from a highly doped p-type germanium monocrystal. It is preferable to employ low-ohmic semiconductor material, for example of 0.01 ohm cm. resistance, or a specific resistance in the same order of magnitude. Grown epitaxially upon the slab is a layer 3 of high-ohmic germanium having a specific resistance of about 10 ohm cm. or more. The slab 4, as a rule, has a thickness of about 100 microns or more, and the epitaxial layer 3 grown upon the slab is given a thickness of approximately 20 microns. The conductance type of the epitaxial layer 3 does not differ from that of the slab material, both being of p-type conductance in the example here described. However the dopant concentration in the layer 3 is much smaller than that in the slab 4 so that the epitaxial layer has the desired high-ohmic resistance, namely the above-mentioned specific resistance of about 10 ohm cm., for example. Deposited upon the high-ohmic epitaxial layer is the base layer 2 of the opposite conductance type. That is, in the present example the base layer 2 has n-type conductance. The base layer is preferably highly doped so that its specific resistance is much lower than that of the layer 3, for example in the order of magnitude of 0.01 ohm cm. The base layer 2 is diffused into the collector layer. The thickness of the diffused base region thus produced is approximately 1.5 micron. The contact electrodes 1 and 5 for emitter and base, consisting for example of aluminum and gold respectively, are both relatively small in area. They are deposited upon the base layer 2 by vaporization. Thereafter, the emitter junction 6 is produced by alloying. The junction 7 between the base contact 5 and the base region 2 is ohmic. The emitter material itself is p-conducting, highly doped and low-ohmic.

With a transistor thus designed and produced, the main portion of the direct voltage, applied between emitter contact 1 and collector 4, is impressed across the high-ohmic expitaxial region 3.

Figure 2:
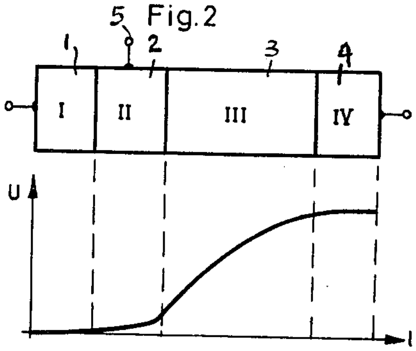
FIG. 2 is an explanatory diagram relating to the same transistor.

In FIG. 2 the active regions established by the emitter, the base and the two collector layers are schematically represented and denoted by I, II, III and IV respectively, generally corresponding to the respective reference numerals 1, 2, 3 and 4 in FIGS. 1 and 4. Also shown in FIG. 2, in proper relation to the schematic representation of the four-region transistor, is a graph indicating on the ordinate the voltage U versus respective localities along the length L of the current-flow path in the transistor.

When charge carriers (holes) are injected through the base II (region 2 in FIG. 1) the space-charge zone located in the grown region III (corresponding to region 3 in FIG. 1) at the junction from the n-type base II (n) to the weakly p-conducting ($p^-$) intermediate layer III decreases with increasing current density above a given current value. When the voltage between base III and collector IV is kept constant, the space charge in the intermediate layer III, produced by the fixed ion charges, is compensated by the moving charge carriers to the extent the current through the intermediate layer III increases. In this manner, there will be reached a condition where, at a given current magnitude, the moving charge carriers fully compensate the fixed space charges. When thereafter the number of the charge carriers injected from the base further increases, then the high-ohmic intermediate layer III becomes flooded with positive charge carriers. This corresponds to the same effect as if the base II became widened into the intermediate region III. Then, the fixed space charges are not only fully compensated by moving charge carriers, but the travelling charge carriers become by far preponderant. Consequently the base does not constitute a region of constant thickness. Its effective thickness is rather variable once a given current magnitude is exceeded.

In principle, the essential difference of the behaviour just described from that of the semiconductor devices designated as pnip transistors, resides in the fact that the effective base thickness commences to vary only above a certain current magnitude, whereas the base thickness in pnip transistors constitutes a continuously variable magnitude beginning from lowest current values.

Figure 3:
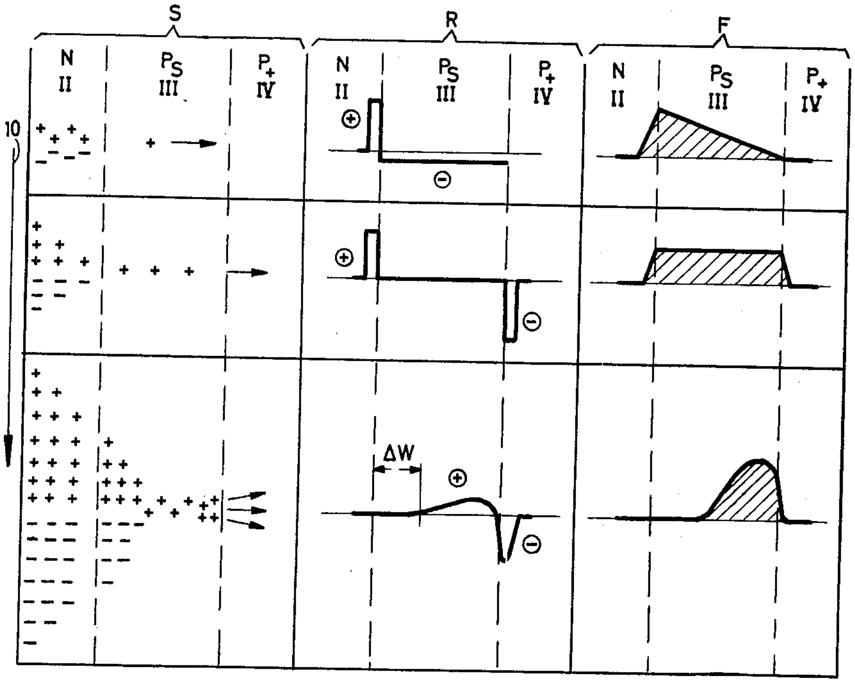
FIG. 3 is another explanatory representation relating to the operational properties of the active transistor regions.

The dependency of different parameters upon the collector current in a transistor according to the invention is represented in FIG. 3 as a function of the locality in the transistor. Denoted in FIG. 3 by the same reference characters as in FIG. 2 are the base region II, the high-ohmic grown epitaxial region III, and the collector region IV. Indicated beneath the designations II, III, IV in the vertical portion denoted by S (of FIG. 3) is the distribution of the injected charge carriers. In the example here chosen, these charge carriers are represented by holes designated by a plus (+) sign, and by electrons designated by a minus (−) sign. The number of charge carriers is shown balanced in the base region II to indicate neutrality. In the direction of the vertical arrow 10 at the left of the diagram, the degree of injection increases, as well as the collector current. Commencing at certain current densities, the concentration of the movable charge carriers within the epitaxial layer III becomes comparable with, or large relative to, the fixed space-charge density. The space-charge density itself is given by the dopant concentration and hence is very much different for high-ohmic and low-ohmic grown layers respectively. With a constant voltage between collector and base electrodes, the width of the space-charge zone and the field distribution in this zone vary with the density of the carriers travelling through the base-collector region, and hence vary in dependence upon the current density.

Entered in the diagram portion R, at the right of the representation of the charge-carrier distribution, are the space-charge conditions. The field distribution is likewise shown in FIG. 3, next to the space-charge conditions, in the portion denoted by F. In the case of mutual compensation between fixed and movable charge carriers, the field strength in the epitaxial layer III is constant. With increasing carrier concentration, the field strength is no longer constant but increases at an increasing rate outside of the seemingly widened base region. It will be recognized that, commencing with a certain current value, the effective base thickness at increasing current density will more and more penetrate into the high-ohmic epitaxial layer III and thus will be broadened more or less deeply into this layer. As a result of this increase in effective base thickness, the limit frequency at high currents decreases. With increasing carrier injection, the space-charge zone shrinks and becomes displaced into the direction to the p-$p^-$ junction between regions III and IV.

A transistor according to the invention, therefore affords the possibility of controlling or regulating current gain (amplification) at high frequencies by varying an additional direct-current proportion. At small current values, corresponding to a slight carrier injection, the conditions characteristic of a normal pnp transistor obtain; particularly the limit frequency is then given by the actual base thickness. However, commencing with a certain current magnitude whose value depends upon the specific resistance of the epitaxial region III and hence is characteristic of a particular transistor, the behaviour peculiar to the invention comes about. That is, this phenomenon, involving an increase in effective base thickness, commences with degrees of injection at which the fixed and movable space-charge proportions in the high-ohmic intermediate region III will just compensate earth other.

With increasing collector current, the effective base regions extends into the epitaxial region III as explained above. It is apparent, that this increase in effective base thickness (ΔW) and the described change in space-charge conditions do not only occur with a high-ohmic intermediate region of the same conductance type as that of the base. As already mentioned, similar changes in space-charge conditions are known from pn$n^-$p transistors and pnip transistors ($n^-$ denotes weak n-type conductance, i denotes intrinsic conductance). However in these a field strength affecting the space charge and consequently an influence of the current density upon the effective base thickness occurs already at smallest current values, whereas in transistors according to the invention such effect takes place only when a given critical current magnitude is exceeded, this critical current value being predeterminable by choice of the conductance and hence dopant concentration of the intermediate grown region between base and collector.

The above-described transistor shown in FIGS. 1 and 4 constitutes a typical embodiment of a pn$p^-$p transistor according to the invention. The following data, some of which have already been mentioned above, will serve to illustrate the critical current magnitude just mentioned. The transistor body consisted of highly doped germanium having 0.01 ohm cm. resistance. The slab 4 had a thickness of about 100 microns. The epitaxially grown region 3 was about 20 microns thick and weakly p-conducting (10 ohm cm.). The base region 2, produced on region 3 by diffusion, was about 0.5 micron thick. The mesa configuration was produced by etching. The rectangular emitter and base contacts 5 and 1 had a size of about 25 x 50 microns and were spaced about 10 microns from each other. The mesa surface had an area of about 75 x 75 microns. There obtained "classical" conditions, that is the effective base thickness was found to be independent of the current magnitude up to currents of about 5 ma. Commencing from this critical value, the effective base thickness, however, increased with increasing current magnitude.

Transistors according to the invention permit being controlled and regulated, especially at high frequencies, by applying an additional direct current to the base. This is due to the fact that an increase in effective base thickness is tantamount to correspondingly increasing the current amplification factor (gain) $\alpha_{limit}$. Such transistors further exhibit increased reliability against reverse injection from the collector contact, due to the presence of the grown intermediate layer. Also of advantage is the improved thermal stability at high current densities, resulting from the fact that the current amplification cannot increase beyond the unity value so that no switching-through of the transistor occurs.

Reltative to the particular electrode and dopant substances, those used in transistors according to the invention need not differ from the substances generally employed for the particular semiconductor material. For example, the emitter electrodes may consist of aluminum not only on germanium but also on silicon. Gold with a suitable addition of dopant substance is suitable as collector electrode material for germanium and silicon. For germanium the preferred donor dopant is antimony, and gallium or indium are suitable acceptor dopants. For silicon, phosporus or antimony are used as donors, and boron or gallium as acceptor. Preferred as base contact for germanium is antimony-containing gold, whereas aluminum is well suitable for silicon.

To those skilled in the art it will be obvious upon a study of this disclosure that our invention is not limited to the particular design and materials of the embodiment illustrated and described herein but can be modified in various respects without departing from the essential features of our invention and within the scope of the claims annexed hereto.

What is claimed is:

1. A diffused-base mesa transistor, comprising a monocrystalline semiconductor body of germanium having four regions of respectively different conductance, one of said regions being the collector and forming an acceptor-doped p-type germanium slab of relatively low ohmic resistance and at least 100 micron thickness, said slab being larger than the three other regions and carrying said other regions, the second one of said regions being an epitaxially grown mesa foot portion of said slab and forming part of the collector, said epitaxial region being acceptor-doped and having an ohmic resistance of at least 10 ohm cm. and a thickness of about 20 micron, the third region constituting the base of the transistor and consisting of n-type germanium and being diffusion-joined with said second region to form a p-n junction therewith, said base region having a thickness of about 1 to about 2 microns, and the fourth region being the emitter and being alloyed to the base region to form a p-n junction therewith.

2. A diffused-base high-frequency transistor, comprising a monocrystalline semiconductor body of germanium having four regions of respectively different conductance, one of said regions being the collector and forming an acceptor-doped p-type germanium slab larger than the three other regions and carrying said three other regions, said slab region having a minimum thickness of about 100 microns and a resistance of about .01 ohm cm., the second region being an epitaxial growth portion of said slab and forming part of the collector, said second region having p-type conductance type and a minimum resistance of about 10 ohm cm. and a thickness of about 20 microns, the third regions constituting the base of the transistor and consisting of donor-doped n-type germanium diffusion-joined with said second region to form a p-n junction therewith, said base region having a thickness of about 1.5 microns and a lower resistance than the second region, the fourth region being the emitter and forming an alloyed p-n junction with the base region, and respective metal contacts on the emitter and base regions, each of said contacts having a surface area of about 25 x 50 microns.

References Cited by the Examiner

UNITED STATES PATENTS

| | | | |
|---|---|---|---|
| 3,006,791 | 10/1961 | Webster | 148—187 X |
| 3,028,529 | 4/1962 | Belmont et al. | 148—33.5 X |

OTHER REFERENCES

IBM Technical Disclosure Bulletin, vol. 5, Number 2, July 1962, pages 50 and 51.

Proceedings of the IRE, September 1960, vol. 48, pp. 1642–43, TK 5700 I7.

HYLAND BIZOT, *Primary Examiner.*

ROGER L. CAMPBELL, *Examiner.*